United States Patent
Foster et al.

(10) Patent No.: US 8,314,022 B1
(45) Date of Patent: Nov. 20, 2012

(54) METHOD FOR ETCHING GATE STACK

(75) Inventors: John Foster, Mountain View, CA (US); Kim Van Berkel, Mountain View, CA (US)

(73) Assignee: Intermolecular, Inc., San Jose, CA (US)

( * ) Notice: Subject to any disclaimer, the term of this patent is extended or adjusted under 35 U.S.C. 154(b) by 0 days.

(21) Appl. No.: 13/112,832

(22) Filed: May 20, 2011

(51) Int. Cl.
*H01L 21/3205* (2006.01)

(52) U.S. Cl. ............. 438/591; 438/745; 257/E21.219

(58) Field of Classification Search ........... 257/E21.176, 257/E21.177, E21.224, E21.37, E21.4
See application file for complete search history.

(56) References Cited

U.S. PATENT DOCUMENTS

| 2010/0062590 A1* | 3/2010 | Lin et al. ............. 438/585 |
| 2010/0167514 A1* | 7/2010 | Kirkpatrick et al. ........ 438/587 |

* cited by examiner

*Primary Examiner* — Cheung Lee

(57) ABSTRACT

A method for etching a metal gate stack is provided. The method includes forming a gate stack on a substrate, where the gate stack includes a metal gate. A wet etch process is performed on the gate stack. The wet etch process includes submersing the substrate with the gate stack in an aqueous solution composed of a wet etchant and an oxidizer, removing the substrate from the solution and rinsing the solution from the etched gate stack.

17 Claims, 2 Drawing Sheets

METHOD FOR ETCHING GATE STACK

BACKGROUND

Transistor gate electrodes made of doped polysilicon have long been used in the manufacture of metal oxide semiconductor (MOS) transistors. The use of doped polysilicon gates becomes problematic, however, as the dimensions of gates and gate dielectrics are reduced. In particular, small polysilicon gates can accommodate only a finite amount of dopant material. This limitation can in turn result in a depletion of gate charge carriers at the interface between the gate and gate insulator (dielectric), when the gate electrode of a device is biased to invert the channel. Consequently, the electrical thickness of the gate dielectric is substantially increased, thereby deteriorating the performance characteristics of the transistor, such as reducing the drive current and switching speed. Depletion of the polysilicon gate is thus a fundamental issue that limits further scaling of MOS devices.

Metal gate stacks are an attractive alternative to polysilicon gates since they have a larger supply of charge carriers than doped polysilicon gates. One existing type of metal gate stack structure includes both a lower metal layer and an upper polysilicon layer. When a metal gate stack is inverted, there is no substantial depletion of carriers at the interface between the metal gate layer and the gate dielectric. Accordingly, the transistor's performance is not deteriorated because the electrical thickness of the gate stack is not increased. However, the fabrication of such metal gate stack structures presents its own set of unique challenges due to the nature of the components. For example, for "gate first" integration schemes, a thin metal layer (e.g., TiN) is deposited over a gate insulating layer and substrate, followed by a thicker layer of polysilicon. The thin metal layer, as well as the insulating layer, typically need to be undercut in order to prepare for the formation of the spacers along the sides of the gate stack. Conventional techniques for undercutting these layers are time consuming.

It is within this context that the invention arises.

BRIEF DESCRIPTION OF THE DRAWINGS

The invention, together with further advantages thereof, may best be understood by reference to the following description taken in conjunction with the accompanying drawings.

SUMMARY

Embodiments of the present invention provide a method for etching a metal gate stack. Several inventive embodiments of the present invention are described below.

In one aspect of the invention, a method for etching a gate stack is provided. The method includes preparing a solution of a wet etchant and an oxidizer and receiving a substrate having the gate stack. In one embodiment, the gate stack includes a polysilicon gate disposed over a plurality of layers, wherein the plurality of layers is stacked over each other between the polysilicon gate and a surface of the substrate. The solution contacts the gate stack for a period of time. The method includes rinsing the solution from the gate stack after the period of time.

In another aspect of the invention, a method for etching a metal gate stack is provided. The method includes forming a gate stack on a substrate, where the gate stack includes a metal gate. A wet etch process is performed on the gate stack. The wet etch process includes submersing the substrate with the gate stack in an aqueous solution of a wet etchant and an oxidizer, removing the substrate from the solution and rinsing the solution from the etched gate stack.

Other aspects of the invention will become apparent from the following detailed description, taken in conjunction with the accompanying drawings, illustrating by way of example the principles of the invention.

DETAILED DESCRIPTION

The embodiments described herein provide for a technique to etch a metal gate stack where the metal layer of the gate stack is undercut and results in a uniform distance for a depletion region of a transistor defined by the metal gate stack. It will be apparent, however, to one skilled in the art, that the present invention may be practiced without some or all of these specific details. In other instances, well known process operations have not been described in detail in order not to unnecessarily obscure the present invention.

Figure 1A:
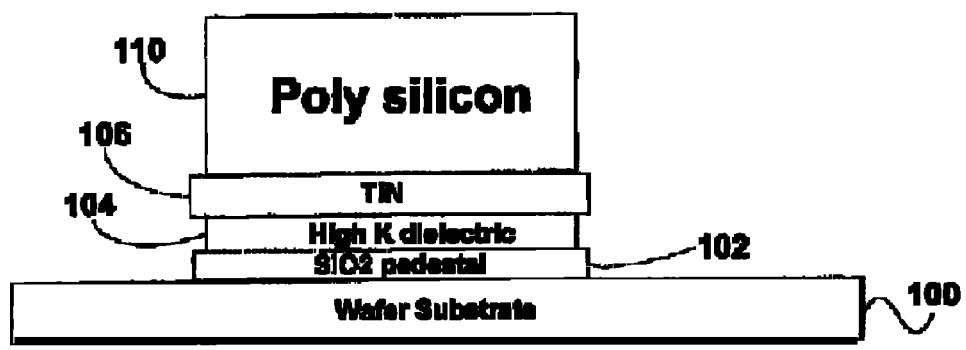
FIG. 1A is a simplified schematic diagram illustrating an etched gate stack prior to a post gate patterning process in accordance with one embodiment of the invention.

FIG. 1A is a simplified schematic diagram illustrating a cross section of an etched gate stack prior to a post gate patterning process in accordance with one embodiment of the invention. Substrate 100 supports silicon dioxide pedestal 102, high K dielectric layer 104, metal layer 106, and polysilicon layer 110. Each of these layers is disposed over each other to form the gate stack. One skilled in the art will appreciate that known deposition and etch techniques may be utilized in order to form the structure depicted in FIG. 1A. In one embodiment, substrate 100 is a silicon substrate although this is not meant to be limiting. High K dielectric layer 104 may be composed of any suitable insulating material such as hafnium or zirconium based materials, e.g., hafnium silicate, hafnium dioxide, zirconium silicate, and zirconium dioxide or other high K materials such as lanthanum oxide, tantalum oxide, barium strontium titanium oxide, barium titanium oxide, strontium titanium oxide, yttrium oxide, aluminum oxide, lead scandium tantalum oxide, and lead zinc niobate. Metal layer 106 may be any suitable conductive layer, which include W, Ni, Co, TaN, Ru—Ta, TiN, Ni—Ti, Ti—Al—N, Zr, Hf, Ti, Ta, Mo, MoN, WN, Ta—Pt and Ta—Ti. As illustrated in FIG. 1A the various layers stacked over each other do not have a consistent width. That is, the cross-section view shows layers 102 through 110 having varying widths. In addition, the width may vary across a length of each layer. For example, metal layer 106 may have varying widths along a length of the metal gate, which results in a varying distance to the depletion region. It is desirable to undercut the layers disposed under layer 110 so that a spacer added to the sides of the gate stack will more readily protect the gate stack from various processes such as cleans, etches, and silicide processes, and so that the width of the layers under layer 110 is more uniform along a length of the gate stack. It should be appreciated that the Figures provided herein are illustrative and not necessarily drawn to scale.

Figure 1B:
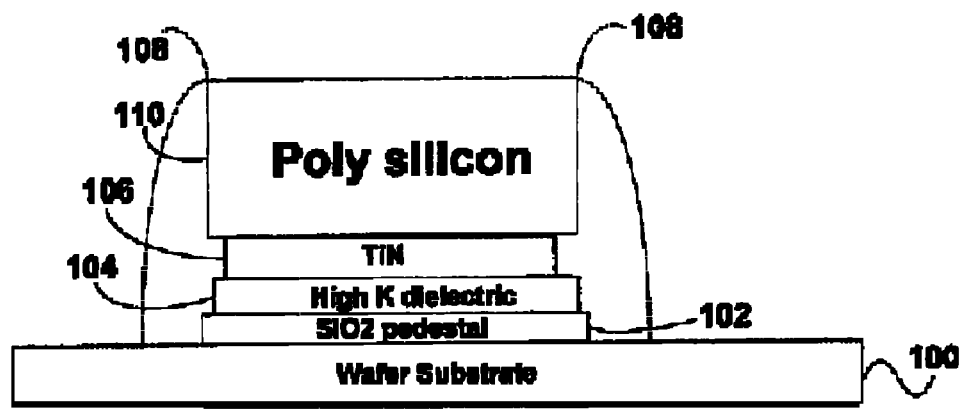
FIG. 1B is a simplified schematic diagram illustrating an etched gate stack after a post gate patterning process is applied to the gate stack in accordance with one embodiment of the invention.

FIG. 1B is a simplified schematic diagram illustrating a cross-section of the gate stack of FIG. 1A after a post gate patterning process is applied to the gate stack in accordance with one embodiment of the invention. The gate stack includes layers 110, 106, 104, and 102 disposed over substrate 100. After the post gate patterning process described in more detail below, layers 106, 104, and 102 are slightly undercut in order to enable successful formation of the spacers 108 along each side of the gate stack. Spacers 108 are disposed along the sides of the gate stack in a later processing step. The post gate patterning process provides for an etchant and an oxidizer contemporaneously applied to the side surfaces of the gate stack. In one embodiment, the etchant is an aqueous wet solution, such as hydrofluoric acid (HF). The oxidizer is a mild oxidizer in one embodiment and may include hydrogen peroxide ($H_2O_2$) or ozonated water. The contemporaneous application of the wet etchant and the mild oxidizer in a single solution consistently removes an oxide layer as it forms on the side surfaces of the gate stack in order to efficiently apply an undercut to the gate stack in order to prepare for further processing.

Figure 2:
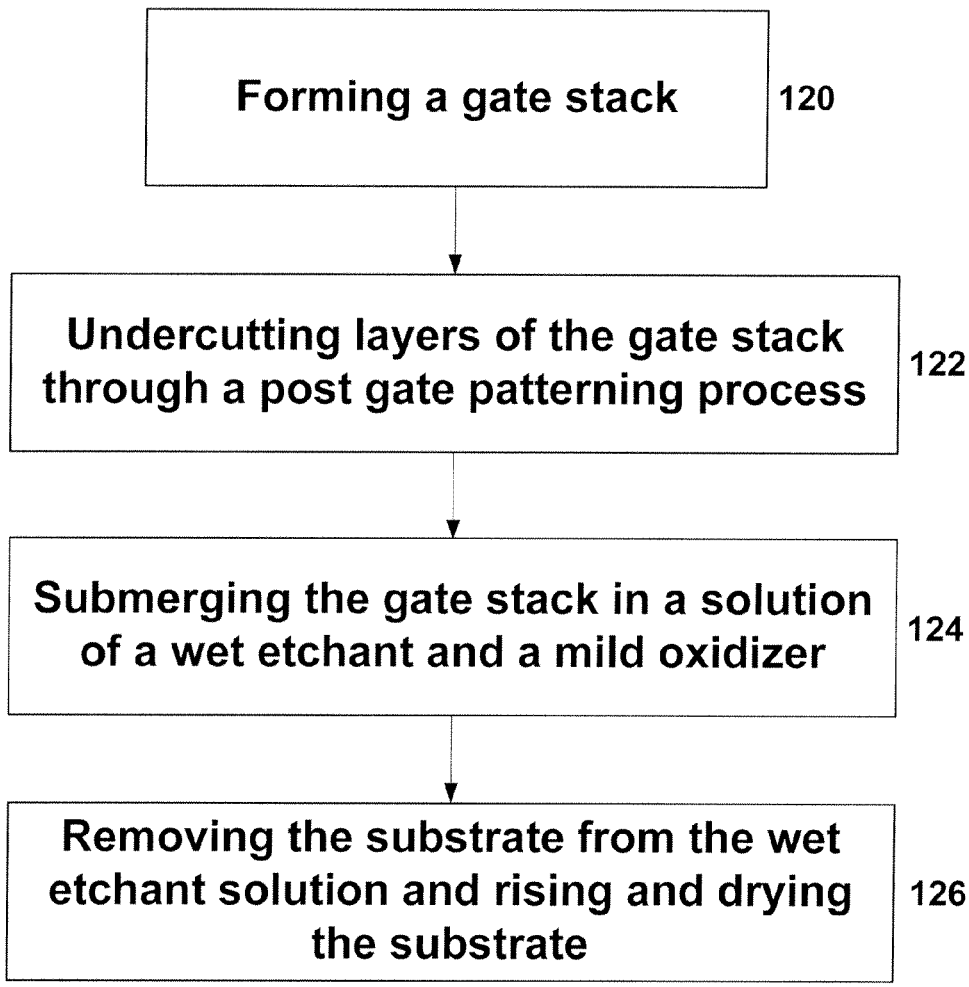
FIG. 2 is a simplified schematic diagram illustrating a method for etching a gate stack in accordance with one embodiment of the invention.

FIG. 2 is a simplified schematic diagram illustrating a method for etching a gate stack in accordance with one embodiment of the invention. The method initiates with operation 120 where a gate stack is formed on a substrate. For example, the substrate depicted in FIG. 1A is one example of a substrate having a gate stack formed thereon. The formation of the gate stack is achieved through known processes for forming high k metal gates in one embodiment. The method then advances to operation 122 where a portion or certain layers of the gate stack are undercut or etched through a post gate patterning process. In one embodiment, the post gate patterning process is a wet etch process as defined below. The method then proceeds to operation 124 where the substrate having the gate stack is submerged or submersed in a solution of a wet etchant and a mild oxidizer, as described herein. It should be appreciated that the solution may also be sprayed onto the gate stack surfaces. The solution is an aqueous solution that may include hydrofluoric acid as the etchant and one of hydrogen peroxide or ozonated water. Exemplary concentrations of the hydrofluoric acid and hydrogen peroxide are listed in Table 1 below. The substrate and the gate stack on the substrate are submerged for a period of time. Upon expiration of the period of time, the substrate is removed from the wet etchant solution and the substrate and the gate stack may be rinsed and dried through known processes utilized in the semiconductor industry as illustrated in operation 126. In one embodiment, the substrate is rinsed with deionized water and dried for further processing.

TABLE 1

| $H_2O_2$ conc | time | HF | TiN loss |
| --- | --- | --- | --- |
| 0.3 | 120 | 200:1 | −19.1 |
| 0.3 | 120 | 300:1 | −15.3 |
| 0.3 | 120 | 400:1 | −16 |
| 0.3 | 180 | 200:1 | −30.5 |
| 0.3 | 180 | 300:1 | −21.9 |
| 0.3 | 180 | 400:1 | −22.7 |
| 0.3 | 60 | 200:1 | −11.5 |
| 0.3 | 60 | 300:1 | −8.6 |
| 0.3 | 60 | 400:1 | −7.6 |
| 1.5 | 120 | 200:1 | −24.1 |
| 1.5 | 120 | 300:1 | −19.4 |
| 1.5 | 120 | 400:1 | −19.5 |
| 1.5 | 180 | 200:1 | −35.9 |
| 1.5 | 180 | 300:1 | −31.4 |
| 1.5 | 180 | 400:1 | −32.1 |
| 1.5 | 60 | 200:1 | −13.4 |
| 1.5 | 60 | 300:1 | −8.6 |
| 1.5 | 60 | 400:1 | −9.4 |
| 3 | 120 | 200:1 | −26.6 |
| 3 | 120 | 300:1 | −24.4 |
| 3 | 120 | 400:1 | −23.4 |
| 3 | 180 | 200:1 | −37.1 |
| 3 | 180 | 300:1 | −35.8 |
| 3 | 180 | 400:1 | −34.1 |
| 3 | 60 | 200:1 | −11.9 |
| 3 | 60 | 300:1 | −10.2 |
| 3 | 60 | 400:1 | −9.4 |

Table 1 illustrates a table of various combinations of hydrogen peroxide and hydrofluoric acid along with time periods in which the gate stack was submersed in the solution and the corresponding metal gate layer width loss. The hydrogen peroxide and HF concentrations are in units of weight/weight percent, while the time is represented by seconds and the metal gate loss is in units of angstroms. The temperature of the solution that resulted in the data represented in Table 1 was ambient, i.e., approximately 25° C. As illustrated in Table 1 as the concentration of the oxidizer rises, more of the metal gate is etched. It should be appreciated that in addition to the metal layer being etched, the dielectric layer and the silica dioxide pedestal are also etched. The etchant and oxidizer solution is selective to the polysilicon so that the layers disposed under the polysilicon are undercut.

Table 1 is not meant to be limiting, only exemplary. In one embodiment, the range of the HF concentration (weight/weight) may range between about 0.1% to about 1%. In another embodiment, the range of the HF concentration (weight/weight) may range between about 0.5% to about 0.75%. In one embodiment, the range of the $H_2O_2$ concentration (weight/weight) may range between about 0.1% to about 5%. In another embodiment, the range of the $H_2O_2$ concentration (weight/weight) may range between about 0.5% to about 3%. The concentration of the ozone ($O_3$) in the ozonated water ranges between 5% and 25% (weight percent of dissolved ozone) in one embodiment. In another embodiment the concentration of the ozone in the ozonated water is between about 7% and about 12% (wt/wt). The temperature range for the solution during the etching process is between about 15 C and 60 C in one embodiment. The time for the gate stack to be submerged or exposed to the solution is between about 1 second and about 1 hour.

It should be appreciated that the embodiments described herein provide for an etchant and an oxidizer to be contemporaneously exposed to the side surfaces of a gate stack in order to undercut layers of the gate stack to enhance further processing operations. The simultaneous exposure to the solution containing the mild oxidizer and the wet etchant constantly removes an oxide layer as the oxide layer forms in order to prevent the oxide layer to form and act as a diffusion barrier to oxygen. Alternating the gate stack structure in a solution of a wet etchant and then an oxidizer is a slow process relative to the embodiments described herein as the oxide layer forms and acts as a diffusion barrier.

Any of the operations described herein that form part of the invention are useful machine operations. The invention also relates to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for etching a metal gate stack, comprising:
preparing a solution of a wet etchant and an oxidizer, the solution comprising hydrofluoric acid and one of hydrogen peroxide or ozonated water;
receiving a substrate having the gate stack, the gate stack including a polysilicon layer disposed over a plurality of layers, wherein the plurality of layers are stacked over each other between the polysilicon layer and a surface of the substrate, and wherein the gate stack is patterned;
contacting the patterned gate stack with the solution for a period of time, wherein each layer of the plurality of layers is contemporaneously exposed to the solution to etch side surfaces of each layer of the plurality of layers; and
rinsing the solution from the gate stack after the period of time.

2. The method of claim 1, wherein the wet etchant is an aqueous solution of hydrofluoric acid (HF) having a weight/weight percent of between about of 0.1% to about 1%.

3. The method of claim 1, wherein the patterned gate stack comprises a polysilicon layer disposed over a metal layer, which is disposed over a high K dielectric, which is disposed over a silicon dioxide layer.

4. The method of claim 3, wherein the hydrogen peroxide is an aqueous solution of having a weight/weight percent of between about of 0.1% to about 5%.

5. The method of claim 3, wherein the ozonated water has an ozone concentration having a weight percent of dissolved ozone between about 5% to about 25%.

6. The method of claim 1, wherein the plurality of layers includes a metal layer disposed over a high k dielectric layer.

7. The method of claim 6 wherein the metal layer is titanium nitride.

8. The method of claim 6 wherein the dielectric layer is composed of one of hafnium oxide, hafnium silicon oxide, lanthanum oxide, zirconium oxide, zirconium silicon oxide, tantalum oxide, barium strontium titanium oxide, barium titanium oxide, strontium titanium oxide, yttrium oxide, aluminum oxide, lead scandium tantalum oxide, and lead zinc niobate.

9. The method of claim 1, wherein the period of time is between about one second and about one hour.

10. A method for etching a metal gate stack, comprising:
forming a gate stack on a substrate, the gate stack including a metal gate, the forming comprising:
completing patterning of the gate stack;
performing a wet etch process comprising;
submersing the substrate with the patterned gate stack in an aqueous solution comprising a wet etchant and an oxidizer, the aqueous solution comprising hydrofluoric acid and one of hydrogen peroxide or ozonated water, wherein each layer of the patterned gate stack is contemporaneously exposed to the aqueous solution and wherein side surfaces of each layer of the plurality of layers is etched;
removing the substrate from the solution; and
rinsing the solution from the etched gate stack.

11. The method of claim 10, wherein the metal gate is composed of Titanium nitride (TiN).

12. The method of claim 10, wherein the wet etchant is a solution of hydrofluoric acid (HF) having a weight/weight percent of between about of 0.1% to about 1%.

13. The method of claim 10, wherein the patterned gate stack comprises a polysilicon layer disposed over a metal layer, which is disposed over a high K dielectric, which is disposed over a silicon dioxide layer.

14. The method of claim 13, wherein the hydrogen peroxide is an aqueous solution of having a weight/weight percent of between about of 0.1% to about 5%.

15. The method of claim 13, wherein the ozonated water has an ozone concentration having a weight percent of dissolved ozone between about 5% to about 25%.

16. The method wherein a temperature of the aqueous solution is between about 15 degrees Celsius (C) and about 60 degrees C.

17. The method of claim 10, wherein the rinsing is performed with deionized water.

* * * * *